US012532724B2

(12) United States Patent
Chaji et al.

(10) Patent No.: US 12,532,724 B2
(45) Date of Patent: Jan. 20, 2026

(54) PREVENTING ELECTRODE DISCONTINUATION ON MICRODEVICE SIDEWALL

(71) Applicant: VueReal Inc., Waterloo (CA)

(72) Inventors: Gholamreza Chaji, Waterloo (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 613 days.

(21) Appl. No.: 17/913,391

(22) PCT Filed: Mar. 23, 2021

(86) PCT No.: PCT/CA2021/050380
§ 371 (c)(1),
(2) Date: Sep. 21, 2022

(87) PCT Pub. No.: WO2021/189136
PCT Pub. Date: Sep. 30, 2021

(65) Prior Publication Data
US 2023/0154790 A1 May 18, 2023

Related U.S. Application Data

(60) Provisional application No. 62/993,477, filed on Mar. 23, 2020.

(51) Int. Cl.
*H01L 21/768* (2006.01)
(52) U.S. Cl.
CPC .. *H01L 21/76819* (2013.01); *H01L 21/76814* (2013.01); *H01L 21/76831* (2013.01); *H01L 21/76868* (2013.01)

(58) Field of Classification Search
CPC .............. H01L 21/76814; H01L 21/76819
See application file for complete search history.

(56) References Cited

U.S. PATENT DOCUMENTS

| 7,981,814 B2 | 7/2011 | Schaper | |
|---|---|---|---|
| 2009/0085173 A1* | 4/2009 | Boemmels | H01L 23/53295 438/653 |
| 2016/0308103 A1 | 10/2016 | Hu et al. | |

FOREIGN PATENT DOCUMENTS

| CN | 102386089 A | | 3/2012 | |
|---|---|---|---|---|
| KR | 20010051286 | * | 6/2001 | ............. H01L 21/28 |
| WO | WO-2004000960 A1 | * | 12/2003 | ............. C08L 43/04 |
| WO | WO-2006064416 A1 | * | 6/2006 | ....... H01L 21/76814 |
| WO | 201896455 A1 | | 5/2018 | |

OTHER PUBLICATIONS

WIPO: PCT International Search Report and Written Opinion relating to PCT application No. PCT/CA2021/050380, dated May 28, 2021.

* cited by examiner

*Primary Examiner* — Daniel Luke

(57) ABSTRACT

This disclosure relates to the process of etching and treatment of side walls while processing microdevices. One aspect is to fill the device wall indentation with a polymer. The disclosure relates to a method and device with its structure to the process of etching and treatment of sidewalls. The methods of etching, coating, and curing are used.

14 Claims, 6 Drawing Sheets

PREVENTING ELECTRODE DISCONTINUATION ON MICRODEVICE SIDEWALL

FIELD ON THE INVENTION

This invention relates to the process of etching and treatment of sidewalls while processing microdevices.

SUMMARY

The present invention relates to a method to planarize sidewalls of microdevices, the method comprising, coating a microdevice with a polymer, and removing the polymer by a dry etching process and leaving the polymer in a sidewall indentation to planarize the sidewalls.

BRIEF DESCRIPTION OF DRAWINGS

The foregoing and other advantages of the disclosure will become apparent upon reading the following detailed description and upon reference to the drawings.

Figure 1:
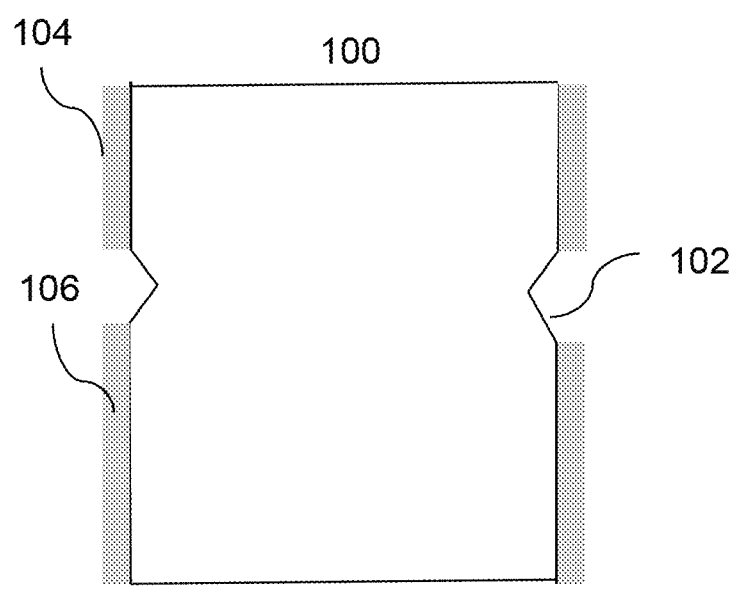
FIG. 1 shows an example of a device 100 where the walls have indentation.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

In this description, the term "device" and "microdevice" are used interchangeably. However, it is clear to one skilled in the art that the embodiments described here are independent of the device size.

During processing microdevices, the sidewalls (or internal walls of a VIA) can have some indentation. This could happen as part of etching or treatment of the sidewalls.

If a conductive layer needs to sit (cover) on the walls, the indentation can cause discontinuation and so the conductive layer can be disconnected.

FIG. 1 shows an example of a device 100 where the walls have an indentation 102. The conductive layers 104 and 106 are disconnected due to this indentation 102.

Depending on the depth of the indentation, it may be hard to fill it with a thin film deposition process.

The present invention is to fill the device wall indentation with a polymer. A polymer layer covers the wall. The polymer layer can also be spin coated or printed (or other methods).

After the coverage of the wall by the polymer, there is excess material on the wall. This excess material is removed by a process of dry etching to leave polymer in the indentation. It is possible to have a thin layer of the polymer still left on the wall after dry etching. This thin layer reduces the sharpness of the indentation edge and as such results in better coverage for subsequent films that will be deposited (or formed) on the walls. The films can be conductive, dielectric, or a combination of them.

In another case, other materials can be used to fill the indentation such as a dielectric, conductive material, and others.

Figure 2A:
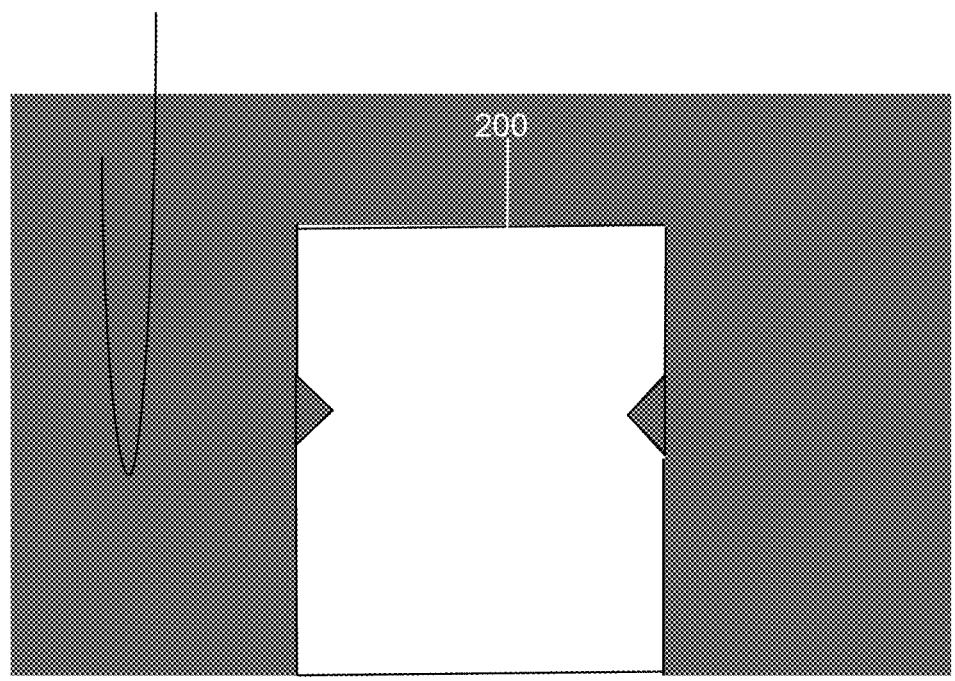
FIG. 2A shows a polymer coating a wall of a device.
Figure 2B:
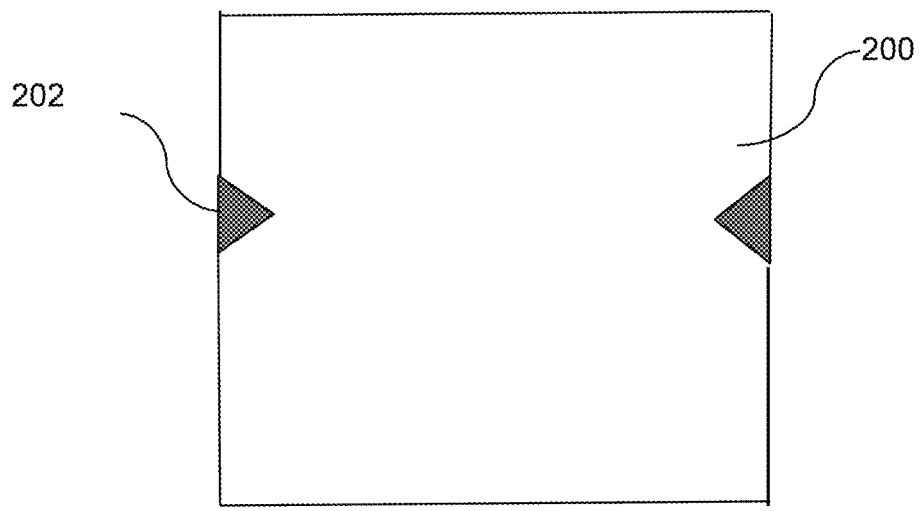
FIG. 2B shows a polymer as etched back by dry etching.
Figure 2C:
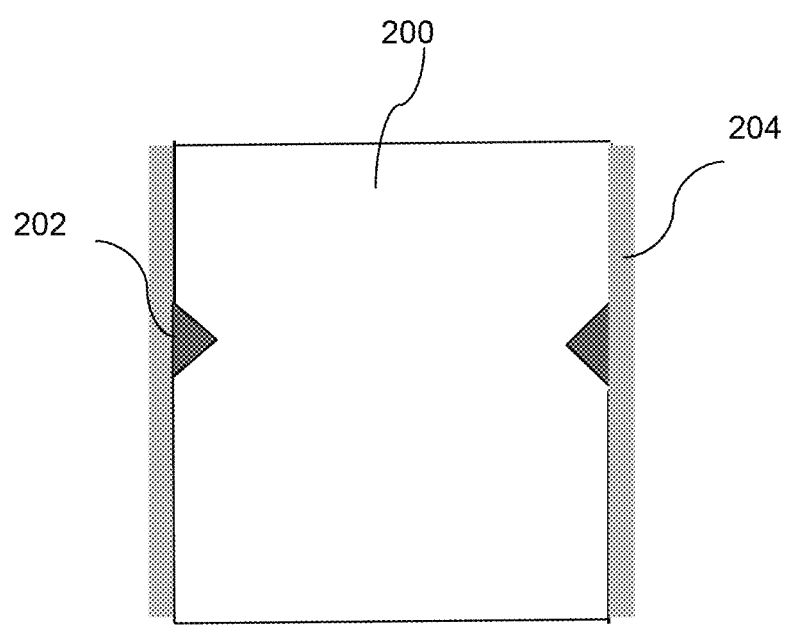
FIG. 2C shows a conductive layer on the wall after dry etching.

FIG. 2 (comprising FIGS. 2A, 2B & 2C) highlights an approach to fill the indentation. In FIG. 2A, a polymer material 208 is coated (or formed by other means) to cover the wall of the device 200. The polymer can be cured after the coating. The curing (thermal or light based) can have a reflow cycle where the polymer can fill the spaces before hard curing. A reflow cycle is a form of curing under temperature of light where the material is soft enough that it can move to small spaces. The polymer is etched backed by a dry etching process (FIG. 2B). The dry etching process can be RIE (reactive-ion etching), ion milling, or ICP (inductively coupled plasma RIE). This process is fairly directional and as a result, the material will stay inside the indentation area 202. After the etching process, conductive layer 204 can form on the wall as demonstrated in FIG. 2C.

Figure 3A:
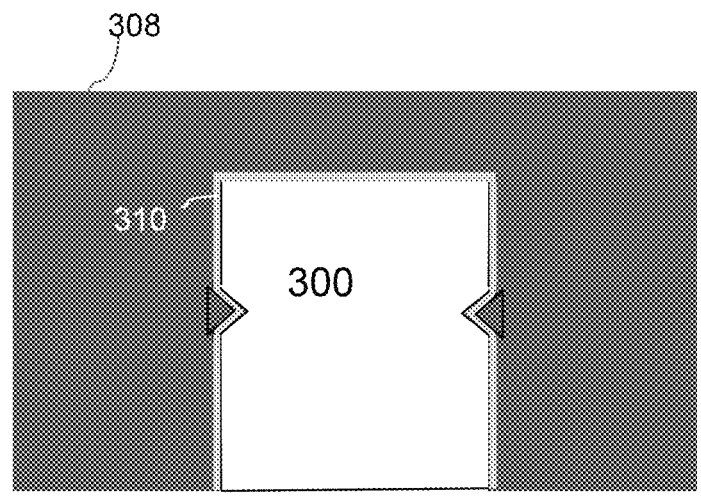
FIG. 3A shows a polymer material coated to cover the wall of the device where there is a film/s that exists between at least a part of the polymer and the wall.
Figure 3B:
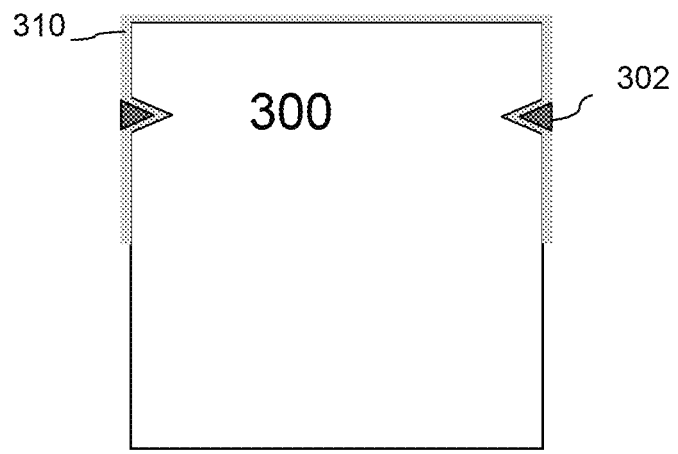
FIG. 3B shows the polymer after the etch process.
Figure 3C:
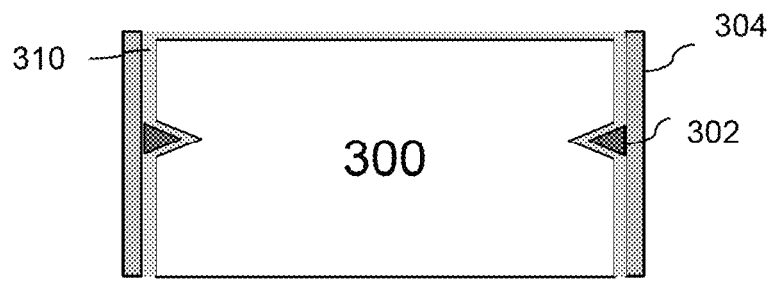
FIG. 3C shows that a conductive layer is formed on the wall after etching.

FIG. 3 (comprising FIGS. 3A, 3B & 3C) highlights a case where there is another film 310 (or combination of films) that is formed on the wall before planarization of indentation.

In FIG. 3A, a polymer material 308 is coated (or formed by other means) to cover the wall of the device 300 where there is a film 310 (or combination films) that exists between at least part of the polymer 308 and the wall. The polymer (or other material) can be cured after the coating. The curing can have a reflow cycle where the polymer can fill the spaces before hard curing.

In FIG. 3B, the polymer, covering the wall of the device 300 where there is a film 310, is etched backed by a dry etching process. The dry etching process can be RIE, ion milling, or ICP. This process is fairly directional and as a result, the material will stay inside the indentation area 302.

After the etching process, a conductive layer 304 can form on the wall as demonstrated in FIG. 3C. The film 310 can be dielectric or conductive or a combination of them. In one case, at least one of the film 310 can be a mask for the etching of the polymer. This layer will protect the device 300 during the etch back of the polymer 308. The film 310 can cover the walls or the surface of the device. The film 310 can also be removed.

Figure 4:
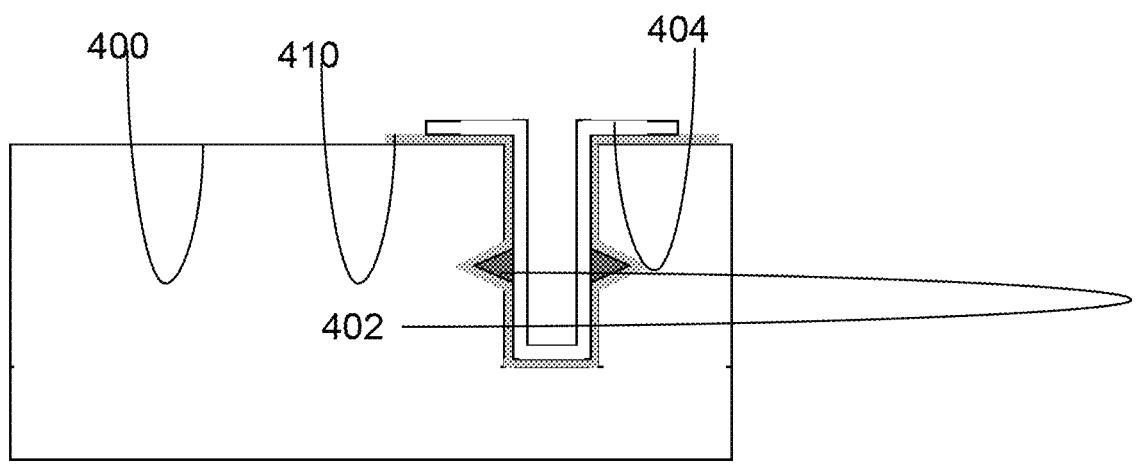
FIG. 4 shows where the wall forms a VIA in the device layers.

FIG. 4 shows an example where the wall forms a VIA in the device 400 layers. Here indentation 402 is filed with polymer (or other film) with the method described above. There can be a film 410 (or combination of films) prior to filling the indentation 402. Another film 404 is deposited after the indentation 402 is filled. Here the film 404 can be conductive to bring a signal from top of the via to the bottom. The VIA can be at the bottom and be coupled to another film.

Method Aspects

The invention discloses a method to planarize sidewalls of microdevices. The method comprises, coating a microdevice with a polymer, and removing the polymer by a dry etching process leaving the polymer in a sidewall indentation to planarize the sidewalls. Here, the polymer is cured. Also, a conductive layer may cover part of the planarized sidewall, and there may be another dielectric between the conductive layer and the planarized sidewall, wherein the dielectric is placed before or after the planarization. Further, the curing may be thermal, or light based and the curing can have a reflow cycle. In one instance, the dry etching process can be RIE, ion milling, or ICP. Additionally, a film can exist between part of the polymer and the sidewall. In one instance, combination films may exist between part of the polymer and the sidewall, wherein the additional film acts as a mask for the dry etching process. Here, the combination films may act as a mask for the dry etching process, and the films comprise of dielectric and conductive layer. Moreover, the additional film can either be a conductive layer or a dielectric. In another aspect, the sidewall is a wall of a VIA, wherein the conductive layer brings a signal from the top to the bottom of the VIA.

The foregoing description of one or more embodiments of the invention has been presented for the purposes of illustration and description. It is not intended to be exhaustive or to limit the invention to the precise form disclosed. Many modifications and variations are possible in light of the above teachings. It is intended that the scope of the invention be limited not by this detailed description, but rather by the claims appended hereto.

The invention claimed is:

1. A method to planarize sidewalls of microdevices, the method comprising:
coating a microdevice with a polymer;
curing the polymer, wherein the curing has a reflow cycle; and
removing the polymer by a dry etching process and leaving the polymer in a sidewall indentation to planarize the sidewalls.

2. The method of claim 1, wherein a conductive layer covers part of the planarized sidewall.

3. The method of claim 1, wherein there is a dielectric between the conductive layer and the planarized sidewall.

4. The method of claim 3, wherein the dielectric is placed before or after the planarization.

5. The method of claim 1, wherein the curing is thermal, or light based.

6. The method of claim 1, wherein the dry etching process can be RIE, ion milling, or ICP.

7. The method of claim 1, wherein an additional film exists between a part of the polymer and the sidewall.

8. The method of claim 1, wherein combination films exist between part of the polymer and the sidewall.

9. The method of claim 7, wherein the additional film acts as a mask for the dry etching process.

10. The method of claim 8, wherein combination films act as a mask for the dry etching process.

11. The method of claim 7, wherein the additional film is either a conductive layer or a dielectric.

12. The method of claim 8, wherein the combination films comprise a dielectric and a conductive layer.

13. The method of claim 1, wherein the sidewall is a wall of a VIA.

14. The method of claim 13, wherein the conductive layer brings a signal from a top to a bottom of the VIA.

* * * * *